(12) United States Patent
Bang et al.

(10) Patent No.: US 10,593,903 B2
(45) Date of Patent: Mar. 17, 2020

(54) ORGANIC LIGHT EMITTING DISPLAY PANEL AND MANUFACTURING METHOD THEREOF

(71) Applicant: LG Display Co., Ltd., Seoul (KR)

(72) Inventors: Hyungseok Bang, Daegu (KR); Jonggeun Yoon, Daegu (KR); Hyeongjun Lim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/020,114

(22) Filed: Jun. 27, 2018

(65) Prior Publication Data
US 2019/0006613 A1 Jan. 3, 2019

(30) Foreign Application Priority Data
Jun. 30, 2017 (KR) .................. 10-2017-0083857

(51) Int. Cl.
| | |
|---|---|
| H01L 51/52 | (2006.01) |
| H01L 27/32 | (2006.01) |
| H01L 51/50 | (2006.01) |
| H01L 27/12 | (2006.01) |
| H01L 51/56 | (2006.01) |
| G09G 3/3233 | (2016.01) |

(52) U.S. Cl.
CPC ...... *H01L 51/5209* (2013.01); *H01L 27/1225* (2013.01); *H01L 27/1248* (2013.01); *H01L 27/3258* (2013.01); *H01L 27/3262* (2013.01); *H01L 51/504* (2013.01); *H01L 51/5271* (2013.01); *H01L 51/5278* (2013.01); *H01L 51/56* (2013.01); *G09G 3/3233* (2013.01); *H01L 2227/323* (2013.01); *H01L 2251/558* (2013.01)

(58) Field of Classification Search
CPC ............. H01L 51/5209; H01L 27/3248; H01L 27/3258; H01L 27/326; H01L 27/3262; H01L 51/5206; H01L 51/5278; H01L 51/56
See application file for complete search history.

(56) References Cited

U.S. PATENT DOCUMENTS

| | | | |
|---|---|---|---|
| 8,981,362 B2* | 3/2015 | Choi ...................... | H01L 27/32 257/40 |
| 2005/0046342 A1* | 3/2005 | Park .................... | H01L 27/3246 313/504 |
| 2006/0125385 A1* | 6/2006 | Lu ....................... | H01L 27/3246 313/506 |

(Continued)

*Primary Examiner* — Joseph C. Nicely
(74) *Attorney, Agent, or Firm* — Seed Intellectual Property Law Group LLP

(57) ABSTRACT

Provided is an organic light emitting display panel including a transistor layer, first and second insulation film pattern, an anode electrode, an emission unit, and a cathode electrode. The transistor layer is disposed on a substrate. The first insulation film pattern is disposed at each pixel and disposed on an inter-layer insulation film covering the transistor layer. The second insulation film pattern has an area larger than an area of the first insulation film pattern and covers the first insulation film pattern. The anode electrode covers the second insulation film pattern and is provided with an edge having a round-shaped cross section. The emission unit covers the anode electrode and a cathode electrode is disposed on the emission unit.

7 Claims, 12 Drawing Sheets

(56) References Cited

U.S. PATENT DOCUMENTS

| | | | |
|---|---|---|---|
| 2007/0046186 A1* | 3/2007 | Kim | H01L 51/5209 |
| | | | 313/504 |
| 2014/0353622 A1* | 12/2014 | You | H01L 27/3258 |
| | | | 257/40 |
| 2014/0353644 A1* | 12/2014 | You | H01L 27/3248 |
| | | | 257/40 |
| 2014/0361253 A1* | 12/2014 | Choi | H01L 27/32 |
| | | | 257/40 |
| 2015/0102313 A1* | 4/2015 | Heo | H01L 27/3248 |
| | | | 257/40 |
| 2015/0194629 A1* | 7/2015 | Liu | H01L 51/56 |
| | | | 257/40 |
| 2015/0357388 A1* | 12/2015 | Pang | H01L 27/3223 |
| | | | 257/40 |
| 2018/0166015 A1* | 6/2018 | Beak | H01L 27/1218 |
| 2018/0301519 A1* | 10/2018 | Ma | H01L 27/3211 |
| 2018/0351126 A1* | 12/2018 | Choi | H01L 51/5036 |

\* cited by examiner

ORGANIC LIGHT EMITTING DISPLAY PANEL AND MANUFACTURING METHOD THEREOF

CROSS-REFERENCE TO RELATED APPLICATION(S)

This application claims the priority benefit of Korean Patent Application No. 10-2017-0083857, filed Jun. 30, 2017, which is incorporated herein by reference for all purposes as if fully set forth herein.

BACKGROUND

Technical Field

The present disclosure relates to an active-matrix organic light emitting display panel and a manufacturing method thereof.

Description of the Related Art

An active-matrix organic light emitting display comprises organic light emitting diodes OLEDs that emit light themselves, and has the advantages of fast response time, high luminous efficiency, high luminance, and wide viewing angle.

An OLED, which is a self-luminous device, comprises an anode and a cathode, and organic compound layers formed between the anode and cathode. The organic compound layers comprise a hole injection layer HIL, a hole transport layer HTL, an emission layer EML, an electron transport layer ETL, and an electron injection layer EIL. When an operating voltage is applied to the anode and the cathode, a hole passing through the hole transport layer HTL and an electron passing through the electron transport layer ETL move to the emission layer EML, forming an exciton. As a result, the emission layer EML generates visible light.

For a high-resolution OLED display, as the size of pixels has become smaller, the size of each patterns in a pixel has become tiny and even a distance between components has become short. As a result, there are some problems caused by current leakage or the like.

BRIEF SUMMARY

The present disclosure provides an organic light emitting display panel suitable for a high-resolution model, and a manufacturing method thereof.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure.

Hereinafter, embodiments of the present disclosure will be described with reference to FIGS. 1 to 11.

Figure 1:
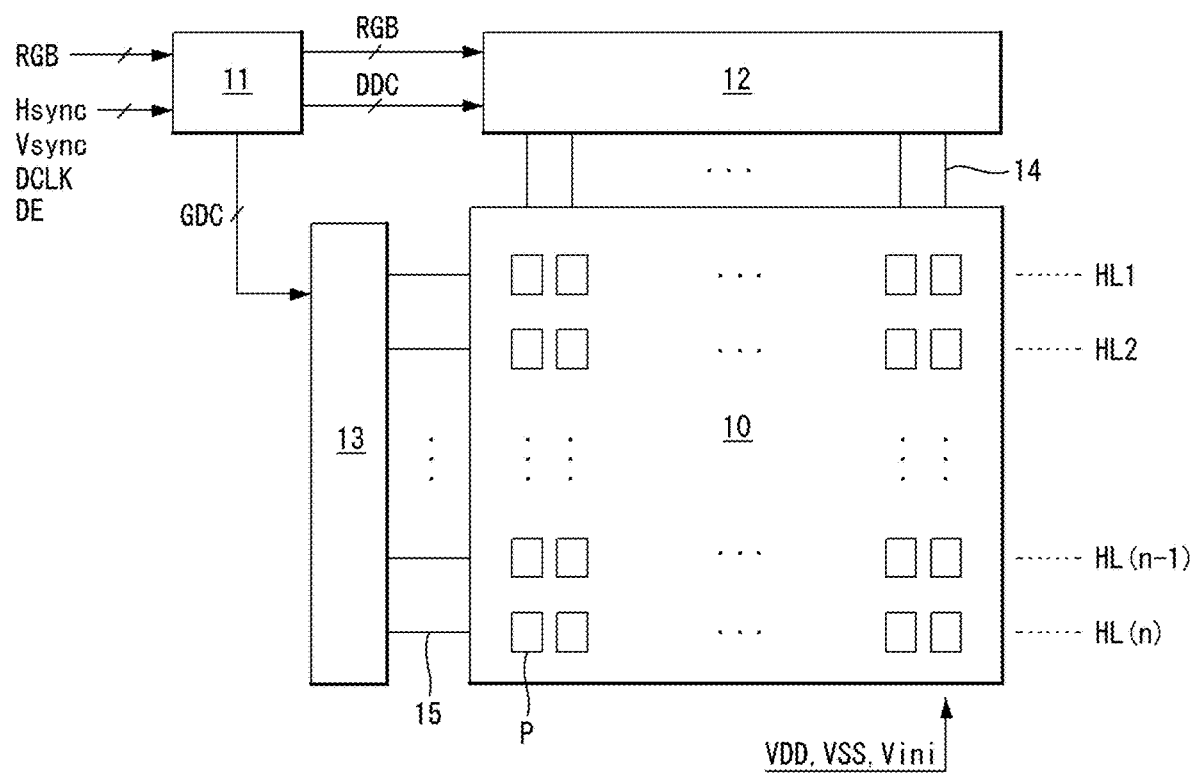
FIG. 1 shows an organic light emitting display according to an embodiment of the present disclosure.

FIG. 1 shows an organic light emitting display according to an embodiment of the present disclosure.

Referring to FIG. 1, an organic light emitting display according to an embodiment of the present disclosure includes: a display panel 10 in which pixels P are formed; a data driving circuit 12 for driving data lines 14; a gate driving circuit 13 for driving gate lines 15; and a timing controller 11 for controlling operation timing of the data driving circuit 12 and the gate driving circuit 13.

A plurality of data lines 14 and a plurality of gate lines 15 intersect each other on the display panel 10, and pixels P are disposed at such intersections in a matrix form. The term "intersect" is used herein to mean that one element crosses over or overlaps another element, and does not necessarily mean that the two elements contact each other. For example, the data lines 14 and the gate lines 15 may intersect each other, but may be physically separated from one another, for example, by one or more layers or elements provided therebetween. Pixels aligned on the same horizontal line forms one pixel row. Pixels P aligned on one pixel row may be connected to one gate line 15, and one gate line 15 may include at least one scan line and at least one emission line. That is, each pixel P may be connected to one data line 14, at least one scan line, and at least one emission line. Pixels P may be supplied with high-potential and low-potential driving voltages VDD and VSS, and an initialization voltage Vini from a power generator which is not illustrated in the drawings.

Transistors TFT of a pixel P may be implemented as transistors each including an oxide semiconductor layer. The oxide semiconductor layer is efficient in manufacturing a large-sized display panel 10 in consideration of electron mobility, a process divination, etc. When a transistor is formed of an oxide semiconductor, the oxide conductor may be Indium Tin Oxide (ITO), Indium Zinc Oxide (IZO), Indium Tin Zinc Oxide (ITZO), or Indium Gallium Zinc Oxide (IGZO). However, aspects of the present disclosure are not limited thereto, and the semiconductor layer of a transistor may be formed of amorphous silicon (a-Si), polycrystalline silicon (poly-Si), or an organic semiconductor.

Figure 2A:
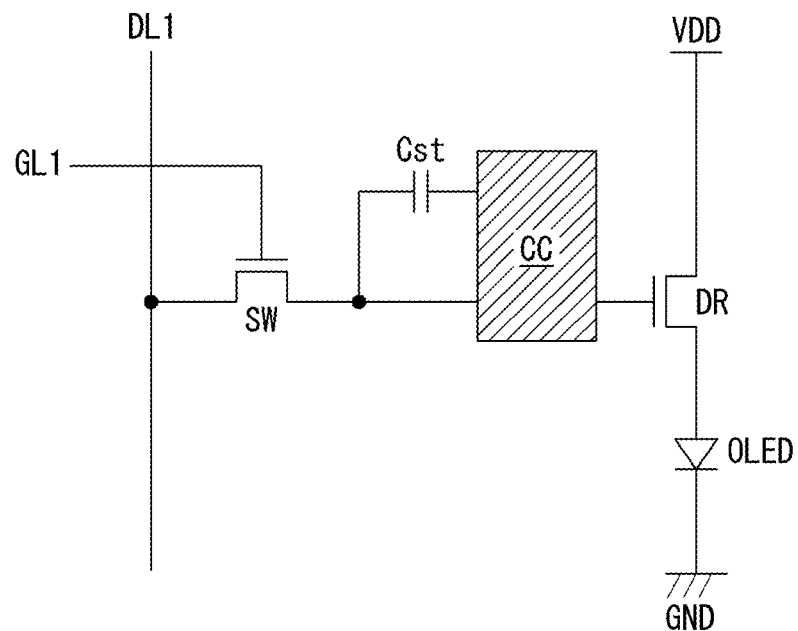
FIGS. 2A and 2B are diagrams illustrating example pixel circuits according to one or more embodiments of the present disclosure.

Referring to FIG. 2A, each pixel includes a switching transistor SW, a driving transistor DR, a compensation circuit CC, and an Organic Light Emitting Diode (OLED). The OLED operates to emit light in accordance with a driving current formed by the driving transistor DR.

In response to a gate signal supplied via a first gate line GL 1, the switching transistor SW performs switching operation so that a data signal supplied via a data line DL is stored as a data voltage in a capacitor. In response to the data voltage stored in the capacitor, the driving transistor DR operates so that a driving current flows between a high-potential voltage line VDD and a low-potential voltage line GND. The compensation circuit CC is a circuit for compensating for a threshold voltage of the driving transistor DR. In addition, a capacitor connected to the switching transistor SW or the driving transistor DR may be positioned inside the compensation circuit CC.

The compensation circuit CC is composed of one or more Thin Film Transistors (TFT) and a capacitor. Configuration of the compensation circuit CC varies depending on a compensation method, and thus examples and description thereof are omitted.

Figure 2B:
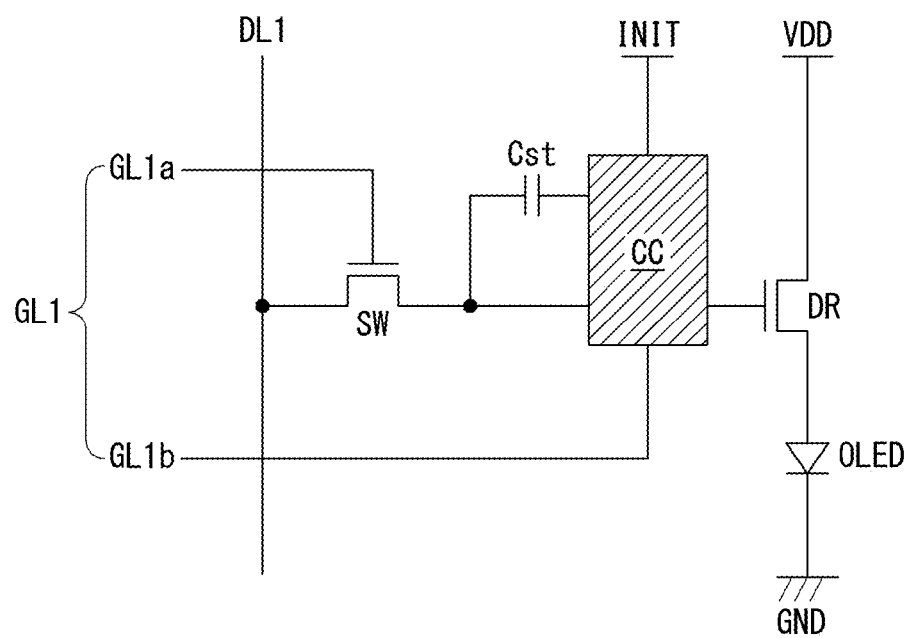

In addition, as illustrated in FIG. 2B, when the compensation circuit CC is included, a pixel may additionally include a signal line and a power line to drive a compensation TFT and supply a specific signal or power. The additional signal line may be defined as a 1-2 gate line GL1$b$ for driving the compensation TFT included in the pixel, such that the gate line GL 1 comprises a 1-1 gate line GL1$a$ and the 1-2 gate line GL1$b$. In addition, the additional power line may be defined as an initialization voltage line INIT for initializing a specific node of the pixel to a specific voltage. However, it is merely an example, and aspects of the present disclosure are not limited thereto.

Meanwhile, FIGS. 2A and 2B show an example in which the compensation circuit CC is included in one pixel. However, if a compensation subject, for example, a data driver 30, is located outside a pixel, the compensation circuit CC may be omitted. That is, one pixel is basically in a 2T(Transistor)1C(Capacitor) structure including a switching transistor SW, a driving transistor DR, a capacitor, and an OLED, but, if a compensation circuit CC is added, one pixel may be in any of various structures, such as 3T1C, 4T2C, 5T2C, 6T2C, and 7T2C.

In addition, FIGS. 2A and 2B show an example in which a compensation circuit CC is located between a switching transistor SW and a driving transistor DR, but additional to or alternative to that compensation circuit CC a compensation circuit CC may be located between the driving transistor DR and the OLED.

Figure 3:
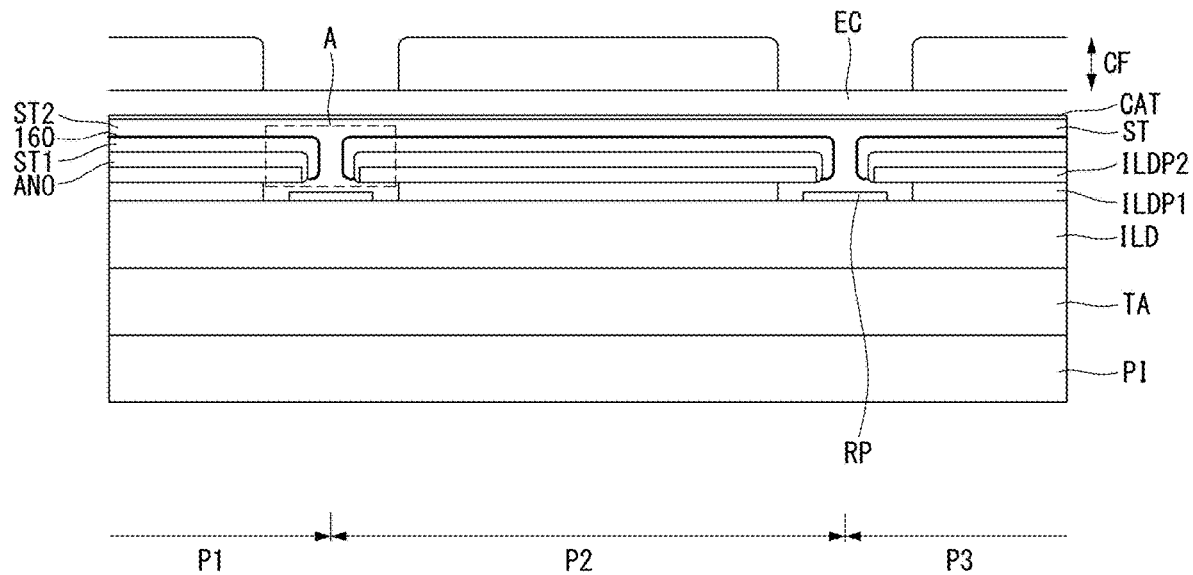
FIG. 3 is a diagram showing a cross section of an organic light emitting display panel according to an embodiment of the present disclosure.
Figure 4:
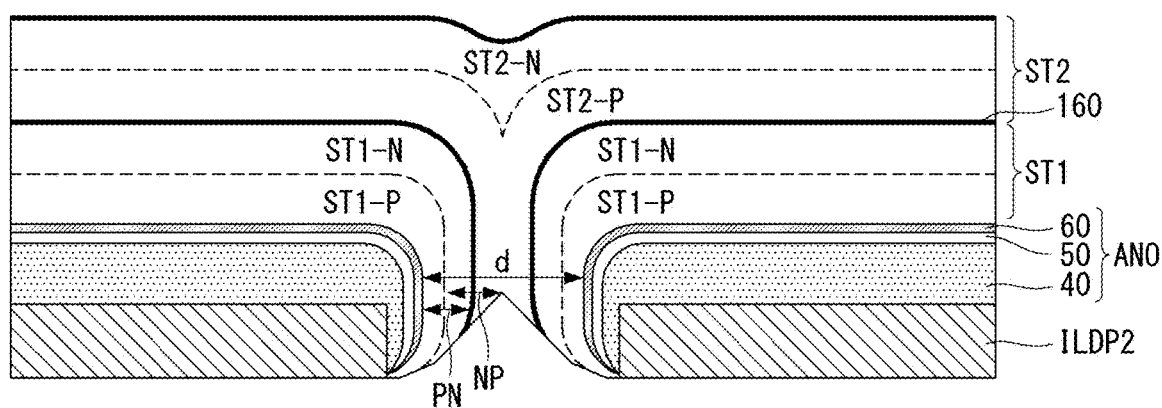
FIG. 4 is a diagram showing an enlarged view of an area between neighboring anode electrodes as shown at region "A" in FIG. 3.

FIG. 3 is a diagram showing a cross section of an organic light emitting display panel according to an embodiment of the present disclosure, and FIG. 4 is a diagram showing an enlarged view of an area between anode electrodes as shown at region "A" in FIG. 3.

Referring to FIGS. 3 and 4, a display panel according to an embodiment of the present disclosure includes a transistor layer TA disposed on a substrate PI, a first insulation film pattern ILDP1, a second insulation film pattern ILDP2, an anode electrode ANO, a first emission structure ST1 (which may be referred to herein as first emission unit ST1), a Charge Generation Layer (CGL) 160, a second emission structure ST2 (which may be referred to herein as second emission unit ST2), and a cathode electrode CAT.

The substrate PI may be formed of a polyimide to achieve a flexible characteristic.

The transistor layer TA includes a driving transistor DT and a switching transistor SW, which are illustrated in FIGS. 2A and 2B.

An inter-layer insulation film ILD is disposed on the transistor layer TA. The inter-layer insulation film ILD may be multi layers of SiOx and SiNx.

The first insulation film pattern ILDP1 is disposed on the inter-layer insulation film ILD, and is not disposed on a boundary portion of a pixel area. That is, the first insulation film pattern ILDP1 may be in regions corresponding to each of the pixels P1, P2, and P3; however, the inter-layer insulation is not disposed at regions corresponding to boundaries between the pixels. The first insulation film pattern ILDP1 may be a SiOx layer.

The first insulation film pattern ILDP1 may be in a shape having round edges.

The second insulation film pattern ILDP2 is disposed on the first insulation film pattern ILDP1, and has a larger area than the first insulation film pattern ILDP1, as viewed from the front of the panel. As a result, a deposition structure of the first insulation film pattern ILDP1 and the second insulation film pattern ILDP2 has a mushroom-like shape. For example, the second insulation film pattern ILDP2 may cover the first insulation film pattern ILDP1 and portions of the second insulation film pattern ILDP2 may extend outwardly beyond edges of the first insulation film pattern ILDP1, e.g., in the boundary regions between pixels as shown in FIG. 3. The second insulation film pattern ILDP2 may be a SiNx layer.

The second insulation film pattern ILDP2 may have a round-shaped edge. A maximum length from an edge of the second insulation film pattern ILDP2 to a center of a maximum inscribed hemi-circle closest to the edge is no more than 1.35, 1.3, 1.25, 1.2, 1.15, 1.1, 1.05 or 1.0 times of that of the thickness of the second insulation film pattern ILDP2. An anode electrode ANO can be formed on the second insulation film pattern ILDP2 in a conformal manner to have a similar round edge.

The second insulation film pattern ILDP2 includes emission units ST1 and ST2 located between the anode electrode ANO and the cathode electrode CAT, and the CGL 160 located between the emission units ST1 and ST2.

A color filter CF is disposed on the emission units ST1 and ST2, for example, after an encapsulation process. As the color filter CF, a separable color filter CF which is separated at pixels P1, P2, and P3 may be used.

Figure 5:
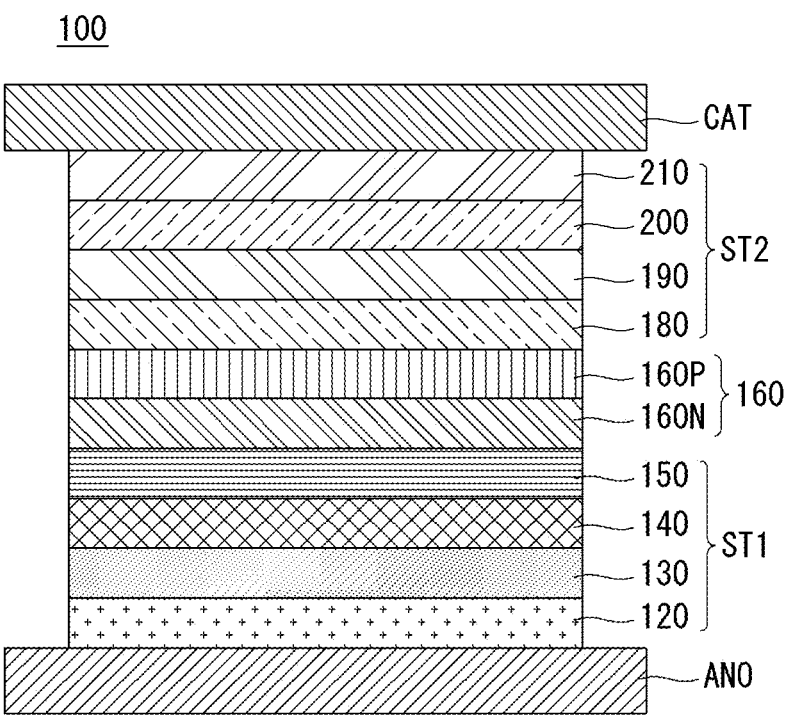
FIG. 5 is a diagram illustrating a deposition structure of emission units.

FIG. 5 is a diagram illustrating a deposition structure of the emission units ST1 and ST2.

Referring to FIGS. 3 to 5, the anode electrode ANO is disposed on the second insulation film pattern ILDP2, and, although not illustrated, the anode electrode ANO is connected through a via-hole to a drain electrode of the driving transistor DR disposed on the transistor layer TA. The anode electrode ANO may include a metal reflective layer 40, an insulation layer 50, and a transparent electrode 60.

The anode electrode ANO may be composed of Al, Cu, Ag, Ni, or an alloy thereof.

The first emission unit ST1 is disposed on the anode electrode ANO. The first emission unit ST1 includes a first emission layer 140. The first emission layer 140 may emit red light (R), green light (G), or blue light (B), and may be composed of a fluorescent material or a phosphor.

The first emission unit ST1 may include a hole injection layer 120 and a first hole transport layer 130 between the anode electrode ANO and the first emission layer 140, and a first electron transport layer 150 on the first emission layer 140. Thus, the first emission unit ST1, which includes the hole injection layer 120, the first hole transport layer 130, the first emission layer 140, and the first electron transport layer 150, is configured on the anode electrode ANO.

The CGL 160 is disposed between the first emission unit ST1 and the second emission unit ST2. The first emission unit ST1 and the second emission unit ST2 are connected by the CGL 160. The CGL 160 may be a p-n junction CGL in which a n-type CGL 160N and a p-type CGL 160P are laminated. In this case, the p-n junction CGL 160 may generate a charge or separate a charge into a hole and an electron so as to inject the hole and the charge to the emission layer. That is, the n-type CGL 160N transports an electron to the first electron transport layer 150, the first electron transport layer 150 supplies the electron to the first emission layer 140 neighboring to both ends thereof, the p-type CGL 160P transports a hole to the second hole transport layer 180 and supplies a hole to a second emission layer 190 of the second emission unit ST2, and, as a result, emission efficiency of the first emission layer 140 and the second emission layer 190 may improve further and a driving voltage may be reduced.

The n-type CGL 160N may be formed of a metal material or a n-type doped organic material.

The p-type CGL 160P may be formed of a material as the same as the material of which the hole injection layer 120 is formed.

On the CGL 160, there is disposed the second emission unit ST2 which includes a second hole transport layer 180, a second emission layer 190, a second electron transport layer 200, and an electron injection layer 210.

The second mission layer 190 may emit red light (R), green light (G), and blue (B), and may be formed of a fluorescent material or a phosphor.

The second emission unit ST2 includes the second hole transport layer 180 located between the CGL 160 and the second emission layer 190, and the second electron transport layer 200 and the electron injection layer 210 on the second emission layer 190. The second hole transport layer 180 may be formed of the same material of which the hole transport layer 130 is formed, the material described in FIG. 1, but aspects of the present disclosure are not limited thereto.

Thus, the second emission unit ST2, which includes the second hole transport layer 180, the second emission layer 190, the second electron transport layer 200, and the electron injection layer 210, is disposed on the CGL 160.

The cathode electrode CAT is disposed on the second emission unit ST2. The cathode electrode CAT may be composed of Mg with a low work function, Ca, Al, Ag, or an alloy thereof.

An emission unit according to the present disclosure includes a round-shaped anode electrode ANO.

Figure 6A:
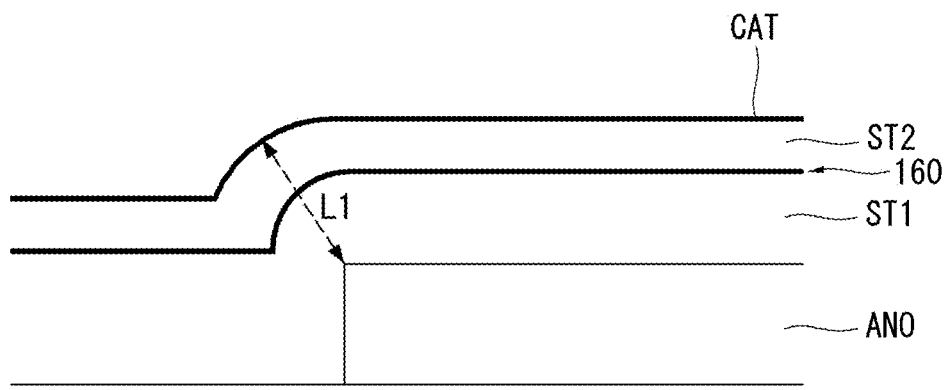
FIG. 6A is a diagram showing a shape of an anode electrode according to a comparative example.
Figure 6B:
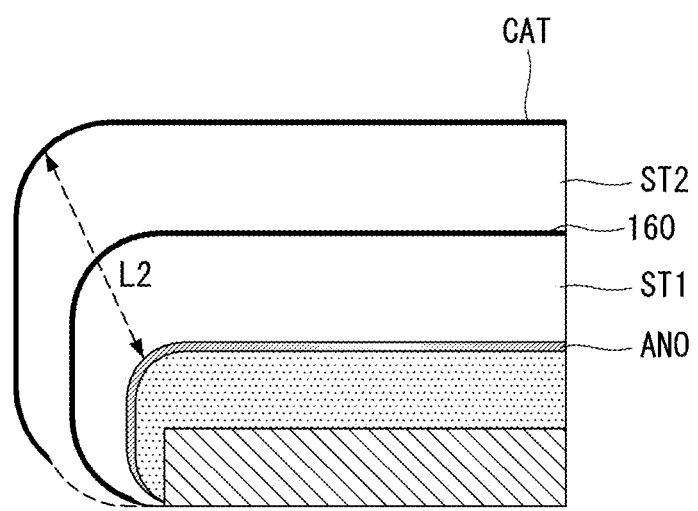
FIG. 6B is a diagram showing a shape of an anode electrode according to one or more embodiments of the present disclosure.

FIG. 6A is a diagram showing a shape of an anode electrode according to a comparative example, and FIG. 6B is a diagram showing a shape of an anode electrode according to an embodiment of the present disclosure.

"L1" in FIG. 6A, indicates a gap between an anode ANO and a cathode electrode CAT of the comparative example, and "L2" in FIG. 6B indicates a gap between an anode electrode ANO and a cathode electrode CAT of an embodiment of the present disclosure. The anode electrode ANO of the comparable example has a sharp end of an edge, but the anode ANO of the present disclosure has a round end of an edge, and thus, "L2" is longer than "L1" when emission units ST1 and ST2 has the same thickness. That is, the present disclosure may prevent a gap between the emission units ST1 and ST2 from narrowing in a specific area. As in the comparative example, if the gap L1 between the anode electrode ANO and the cathode CAT becomes narrow, currents may be flocked into a corresponding area and abnormal light emission may be generated. On the contrary, the present disclosure may prevent the gap L2 between the anode electrode ANO and the cathode electrode CAT from narrowing at an edge end and thus prevent abnormal light emission. In addition, the anode electrode ANO of the present disclosure has a round shape and thus may improve the lighting road effect. As in the comparable example, if the anode electrode ANO has a sharp shape, current leakage may occur at an edge portion of the anode electrode ANO due to the lighting rod effect. The anode electrode ANO of the present disclosure has a round-shaped edge and thus is able to prevent the lighting rod effect.

The CGL 160 according to the present disclosure is separated on basis of pixel unit. That is, a CGL 160 of a first pixel P1 and a CGL 160 of a second pixel P2 are not connected to each other. Thus, lateral current leakage is prevented from occurring through CGLs. The CGL 160 is highly conductive so current leakage is highly likely to occur through the CGL 160. If the CGL disposed in the first pixel P1 and the CGL disposed in the second pixel P2 are connected to each other, current leakage may easily occur between the first pixel P1 and the second pixel P2 through the CGLs. However, the CGL 160 according to the present disclosure is separated on basis of a pixel unit and thus may prevent current leakage between neighboring pixels.

In addition, the first emission unit ST1 according to the present disclosure is configured such that a p-type semiconductor layer ST1-P and a n-type semiconductor layer ST1-N are deposited sequentially on the anode electrode ANO and thus a p-n junction is formed. The p-type and n-type semiconductor layers of the first emission unit ST1 are shown, for example, in FIG. 4. In addition, the first emission unit ST1 is separated between neighboring pixels. The second emission unit ST2 is configured such that a p-type semiconductor layer ST2-P and a n-type semiconductor layer ST2-N are deposited sequentially on the CGL 160, as shown, for example, in FIG. 4. The second emission unit ST2 is continued between neighboring pixels P. The p-type semiconductor layer ST2-P of the second emission unit ST2 is interposed between anode electrodes ANO of neighboring pixels P. The n-type semiconductor layer ST2-N of the second emission unit ST2 is continued above anode electrodes ANO of neighboring pixels P.

As a result, a forward bias p-n junction and a reverse bias n-p junction oppose each other between anode electrodes ANO of neighboring pixels P. As such, the reverse bias n-p junction is formed between neighboring anode electrodes ANO, and thus, current leakage may be prevented from occurring between the neighboring anode electrodes ANO. For example, even though a high voltage is applied to the anode electrode ANO of the first pixel P, current leakage from the anode electrode ANO of the first pixel P to the anode electrode ANO of the second pixel P does not occur due to the n-p junction formed between the first pixel P and the second pixel P.

Following is description about a condition for a structure in which a forward bias p-n junction and a reverse bias n-p junction oppose between anode electrodes ANO of pixels P and in which the first emission unit ST1 between neighboring pixels is separated while the n-type semiconductor layer of the second emission unit ST2 is continued.

Figure 7:
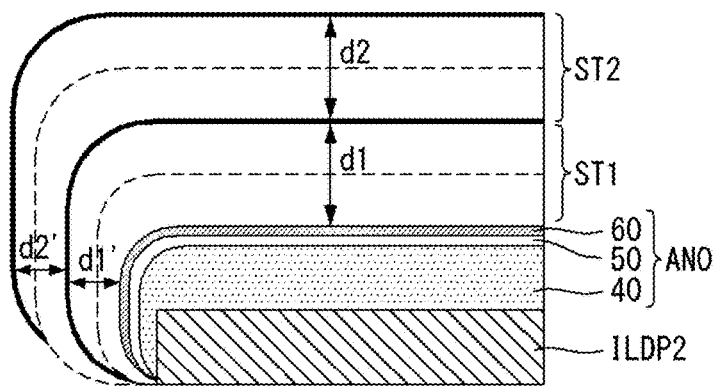
FIG. 7 is a diagram illustrating a first emission unit and a second emission unit on an anode electrode of one pixel.

FIG. 7 is a diagram illustrating a first emission unit ST1 and a second emission unit ST2 on an anode electrode ANO of one pixel P. As shown in FIG. 7, if it is assumed that the first emission unit ST1 and the second emission unit ST2 are formed on an anode electrode ANO of one pixel P, the first emission unit ST1 is implemented as having a horizontal portion and a vertical portion while surrounding the anode electrode ANO, and the second emission unit ST2 is implemented as having a horizontal portion and a vertical portion while surrounding the CGL 160. In FIG. 7, "d1" indicates a thickness of the horizontal portion of the first emission unit ST1, "d2" indicates a thickness of the horizontal thickness of the second emission unit ST2, "d1'" indicates a vertical width of the first emission unit ST1, and "d2'" indicates a vertical width of the second emission unit ST2. Hereinafter, it is assumed that each neighboring anode electrode ANO has the same first width d1' and the same second vertical width d2'.

As shown in FIG. 4, for separation of the first emission unit ST1 between neighboring pixels, a gap between the neighboring anode electrodes needs to be wider than two times a vertical width of the first emission unit.

In addition, a n-type semiconductor layer n of the second emission unit ST2 according to the present disclosure is not interposed between anode electrodes ANO. Thus, a gap d between anode electrodes ANO according to the present disclosure is set to be smaller than two times a sum of the first vertical width d1' and the second vertical width d2' shown in FIG. 7. That is, the condition of "d<2(d1'±d2')" needs to be satisfied.

A manufacturing process for satisfying the above condition will be described with reference to FIGS. 10 to 13.

Figure 8:
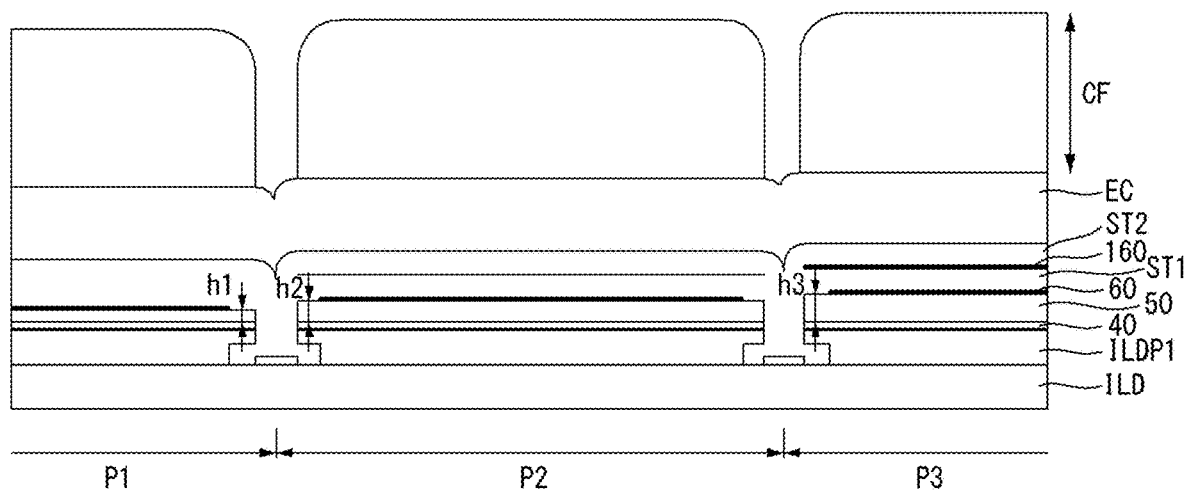
FIG. 8 is a cross-sectional view of an organic light emitting display panel according to a second embodiment of the present disclosure.

FIG. 8 is a cross-sectional view of an organic light emitting display panel according to a second embodiment of the present disclosure. In FIG. 8, components identical or corresponding to those of the aforementioned embodiment are designated by like reference numerals, and description thereof will be omitted.

Referring to FIG. 8, the organic light emitting display panel according to the second embodiment of the present disclosure includes a transistor layer TA disposed on a substrate PI, a first insulation film pattern PILD1, a second insulation film pattern ILDP2, an anode electrode ANO, a first emission unit ST1, a Charge Generation Layer (CGL) 160, a second emission unit ST2, and a cathode electrode CAT.

The anode electrode ANO is in a structure in which a metal reflective layer 40, an insulation layer 50, and a transparent electrode layer 60 are deposited sequentially. The insulation layer 50 has a different thickness at each pixel P. When a first pixel P1 is a red emission region, a second pixel P2 is a green emission region, and a third pixel P3 is a blue emission region, the insulation layers 50 of the anode electrodes ANO of the respective pixels P1, P2, and P3 have thickness as below. An insulation layer thickness h2 of the second pixel P2 is greater than an insulation layer thickness h1 of the first pixel P1 and smaller than an insulation layer thickness h3 of the third pixel P3. As a result, the pixels P1, P2, and P3 may improve microcavity effect between the anode electrodes ANO and the cathode electrodes CAT.

FIGS. 9A to 9F are diagrams illustrating a manufacturing method of an organic light emitting display panel according to the present disclosure.

Figure 9A:
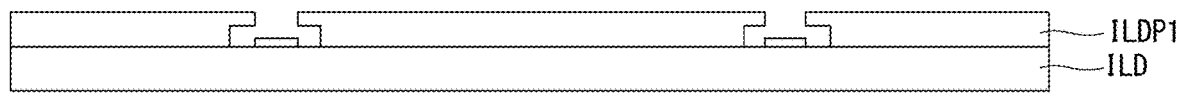
FIGS. 9A to 9F are diagrams illustrating a manufacturing method of an organic light emitting display panel according to the present disclosure.

Referring to FIG. 9A, a first insulation film pattern IDLP1 and a second insulation film pattern ILDP2 are formed on an interlayer insulation film ILD. In FIG. 9A, the second insulation film pattern IDLP2 is on top of the first insulation film pattern IDLP1 and extends beyond from a side of the first insulation film pattern IDLP1 (though IDLP2 is not given in FIG. 9A) The first insulation film pattern ILDP2 and the second insulation film pattern ILDP1 are deposited in a mushroom form using a well-known process.

Figure 9B:

Referring to FIG. 9B, a reflective metal layer 40 is formed on the second insulation film pattern ILDP2. The reflective metal layer 40 may be formed using a sputtering deposition process. If a metal material is deposited on the second insulation film pattern ILDP2 by sputtering, the reflective metal layer 40 may be deposited in a round shape on an edge area of the second insulation film pattern ILDP2. In particular, using the second insulation film pattern ILDP1 and the second insulation film pattern ILDP2 deposited in a mushroom form according to the present disclosure, it is possible to deposit a metal material in a self-align method. Thus, despite a small pixel size in high resolution, the reflective metal layer 40 may be formed using Ag which has high reflectance. Conventionally, a dry etching process, a wet etching process, or a lift-off process is used to form a reflective metal layer, and, in this case, when a pixel size is small, it is difficult to form a reflective metal layer using Ag. On the contrary, the present disclosure performs a deposition process using the first insulation film pattern ILDP1 and the second insulation film pattern ILDP2 in a mushroom form, and thus, it is possible to form the reflective metal layer 40 using Ag even in a display panel having a small pixel size.

In the process of forming the reflective metal layer 40, a dummy reflective pattern RP (see FIG. 3) remains in an area between neighboring pixels P where the first insulation film pattern ILDP1 and the second insulation film pattern ILDP2 are opened.

Figure 9C:
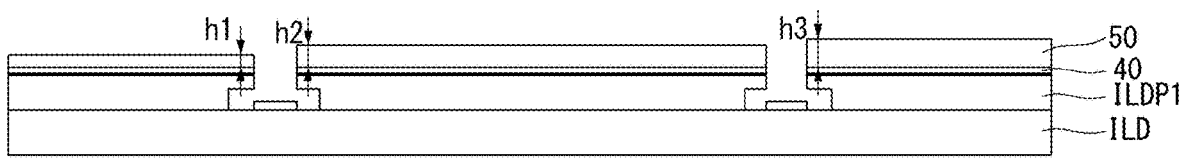

Referring to FIG. 9C, an insulation film 50 is formed on the reflective metal layer 40. The insulation film 50 may have the same thickness at each pixel P, as shown the first embodiment, or a different thickness at each pixel P, as shown in the second embodiment.

Figure 9D:
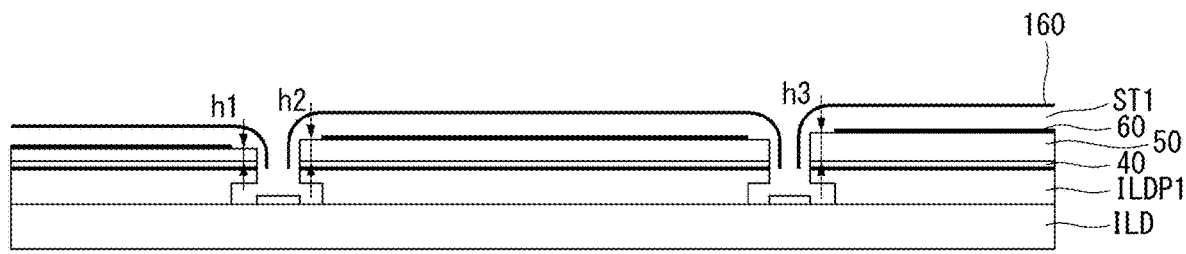

Referring to FIG. 9D, a transparent metal layer 60 is formed on the insulation film 50.

Figure 9E:
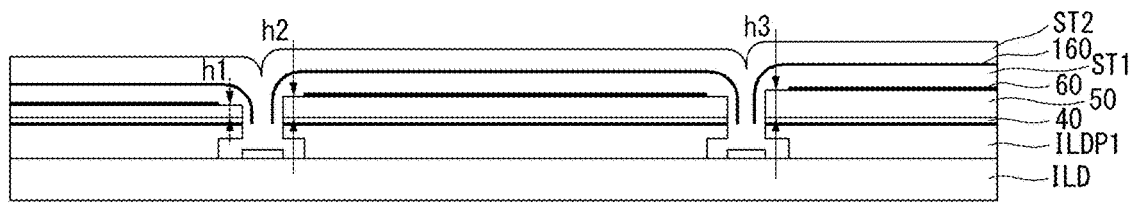

Referring to FIG. 9E, emission units ST1 and ST2 are formed on the transparent metal layer 60.

Figure 9F:
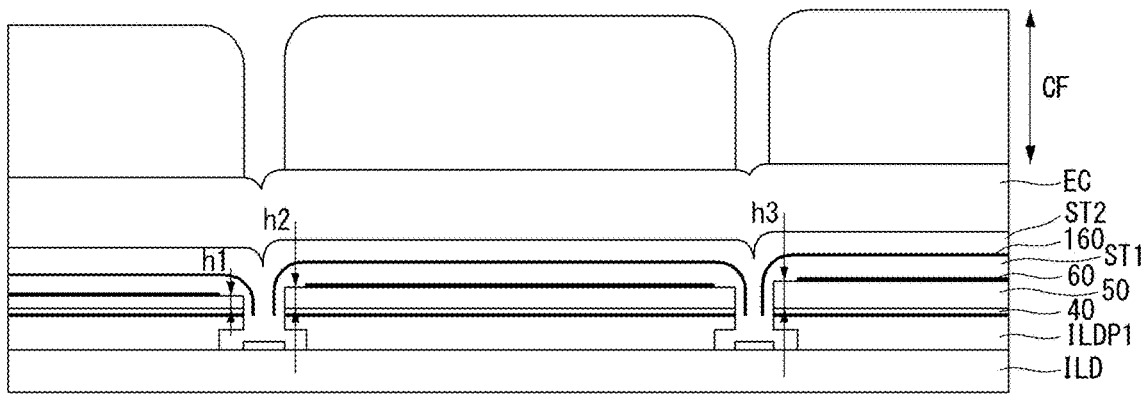

Referring to FIG. 9F, an encapsulation (or Encap) process is performed to form an encapsulation lay EC to cover the emission units ST1 and ST2, and a color filter is formed.

A process shown in FIG. 9D and FIG. 9E employs depositing an organic material. As described above, the first emission unit ST1 according to the present disclosure is separated between neighboring pixels P, and the second emission unit ST2 is continued between pixels P. In particular, a p-type semiconductor layer ST2-P of the second emission unit ST2 is interposed between anode electrodes of neighboring the pixels P; whereas a n-type semiconductor layer n of the second emission unit ST2 can be formed even not interposed between anode electrodes of neighboring pixels P so as to further prevent narrowing between an anode electrode ANO of a pixel P and the cathode electrode CAT. To implement the emission units ST1 and ST2 having the above characteristics, a gap between anode electrodes ANO is a main condition.

FIGS. 10 to 13 are simulation results showing a deposition shape of a first emission unit and a second emission unit according to a gap between anode electrodes. In FIGS. 10 to 13, a first anode electrode ANO indicates an anode electrode of a first pixel P1, and a second anode electrode ANO indicates an anode electrode of the second pixel P2.

Figure 10:
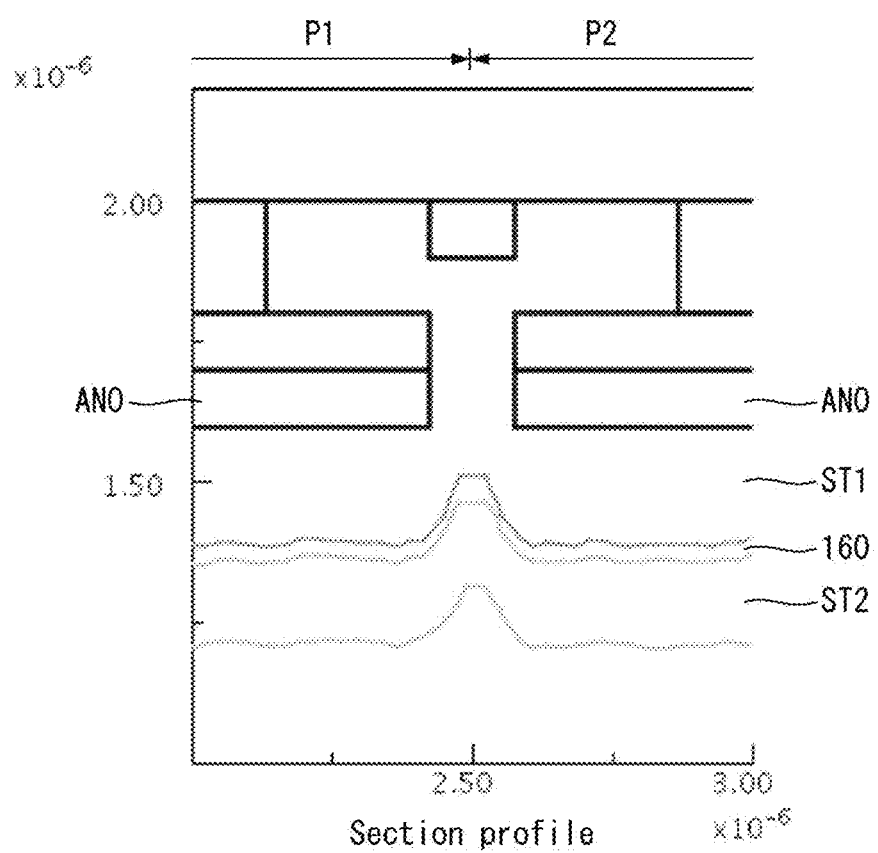
FIGS. 10, 11, 12, and 13 are simulation results showing a deposition shape of a first emission unit and a second emission unit according to a gap between anode electrodes.

FIG. 10 shows the case where the first emission unit ST1 and the second emission unit ST2 are deposited when a gap between the first anode electrode ANO and the second anode electrode ANO is 150 nm. As shown in FIG. 9, if the gap between the first anode electrode ANO and the second anode electrode ANO is too narrow, the first emission unit ST1 of the first pixel P and the first emission unit ST1 of the second pixel P are continued to each other, and the second emission unit ST2 of the first pixel P and the second emission unit ST2 of the second pixel P are also continued to each other.

Figure 11:
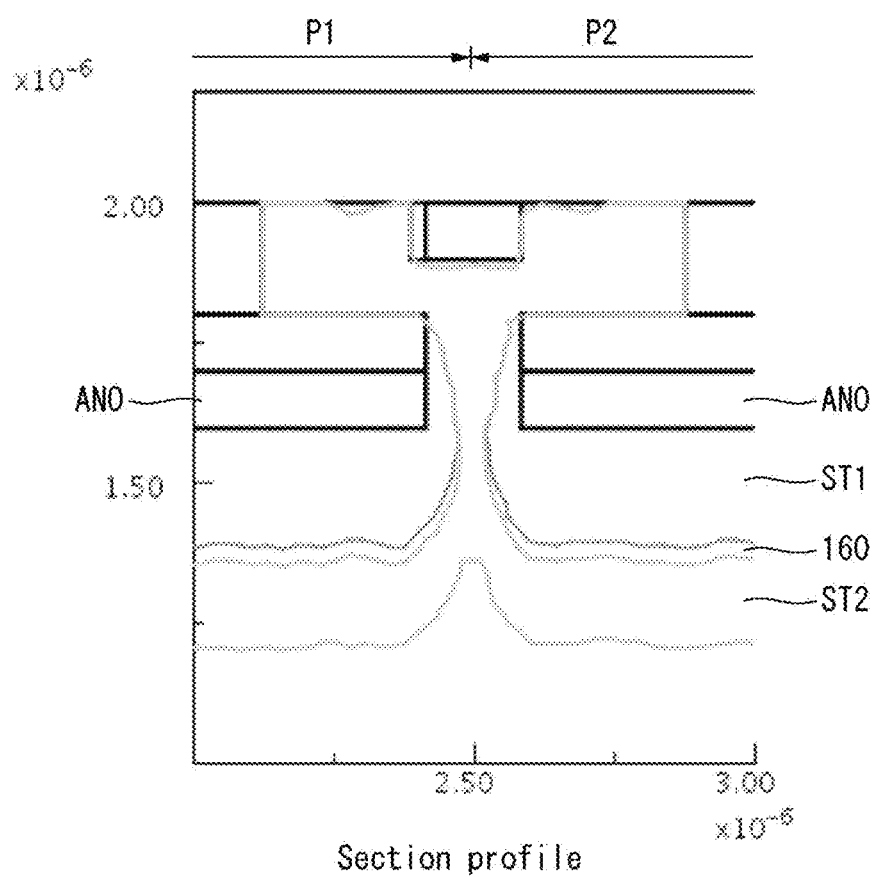
Figure 12:
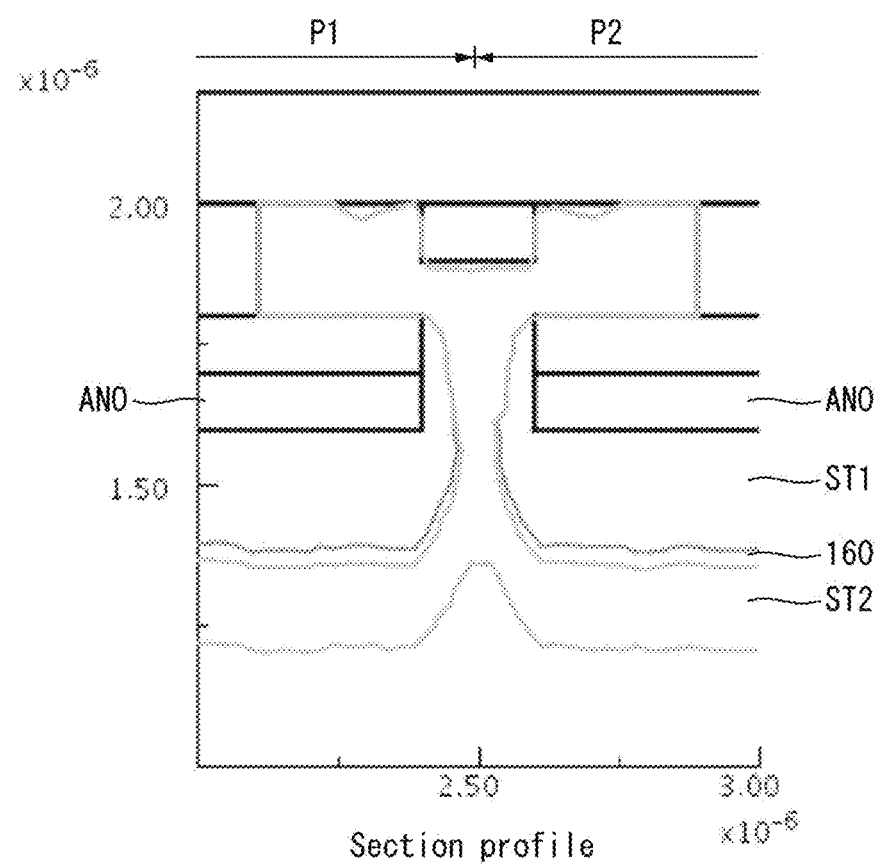

FIG. 11 shows the case where the first emission unit ST1 and the second emission unit ST2 are deposited when a gap between the first anode electrode ANO and the second anode electrode ANO is 175 nm. FIG. 12 shows the case where the first emission unit ST1 and the second emission unit ST2 are deposited when a gap between the first anode electrode ANO and the second anode electrode ANO is 200 nm. In FIGS. 11 and 12, the first emission unit ST1 of the first pixel P and the first emission unit ST1 of the second pixel P are separated from each other. In addition, a partial region of the second emission unit ST2 of the first pixel P and a partial region of the second emission unit ST2 of the second pixel P are interposed between the first anode electrode ANO and the second anode electrode ANO.

Figure 13:
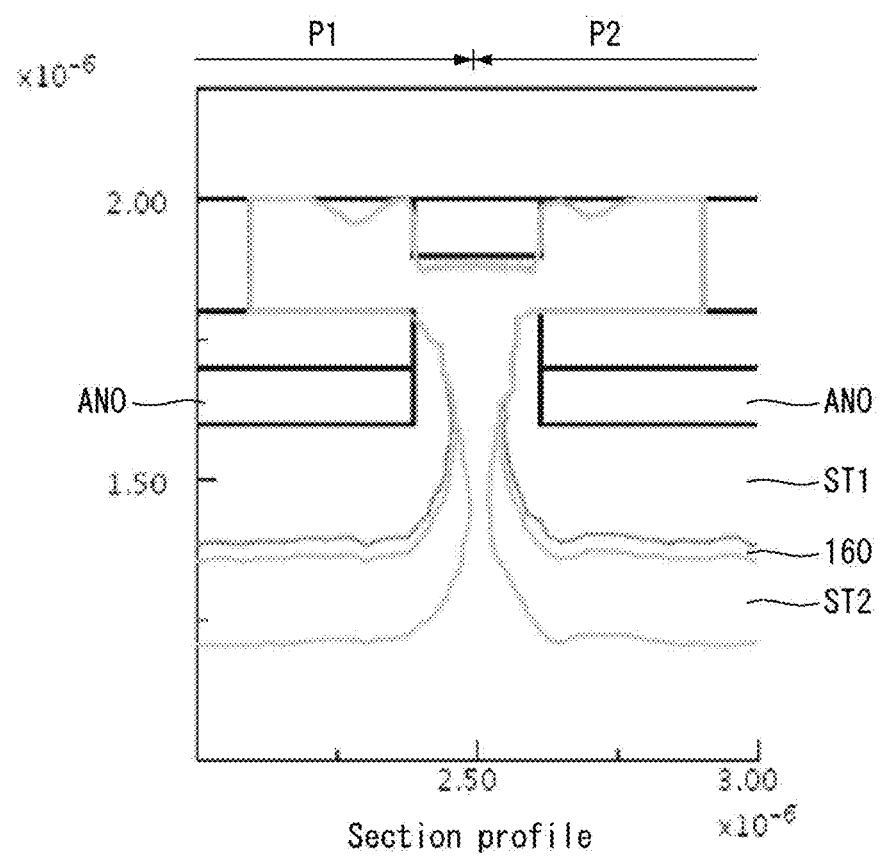

FIG. 13 shows the case where the first emission unit ST1 and the second emission unit ST2 are deposited when a gap between the first anode electrode ANO and the second anode electrode ANO is 225 nm. In FIG. 13, the first emission unit ST1 of the first pixel P is separated from the first emission unit ST1 of the second pixel P, and the second emission unit ST2 of the first pixel P is separated from the second emission unit ST2 of the second pixel P.

As described above with reference to FIGS. 10 to 13, in order to implement the structure of the emission units ST1 and ST2 according to the present disclosure, it is desirable to deposit an organic compound by setting a gap between the first anode electrode ANO and the second anode electrode ANO within a range between 175 nm and 200 nm.

As described above, the present disclosure allows an edge of an anode to have a round or rounded shape, thereby preventing current leakage which possibly occurs at a sharp edge.

The present disclosure allows an organic light emitting layer to fill up a gap between electrodes by appropriately reducing gap between neighboring electrodes, and, in turn, prevents anode-cathode current leakage which possibly occurs due to a short distance between an anode and a cathode.

The present disclosure severs a charge generation layer inside an organic light emitting layer in a multi-stack structure of neighboring pixels, or insulates an organic layer, such as a highly conductive HIL or HTL, thereby preventing current leakage between neighboring pixels.

The present disclosure allows a p-n junction and a n-p junction of emission units to oppose between neighboring electrodes, thereby preventing current leakage between anode electrodes.

The present disclosure minimizes a gap between anode electrodes, thereby maximizing an emission area and thus improving luminance.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display panel, comprising:
   a transistor layer disposed on a substrate;
   an inter-layer insulation film covering the transistor layer;
   a first insulation film pattern disposed on the inter-layer insulation film at regions corresponding to each of a plurality of pixels;
   a second insulation film pattern covering the first insulation film pattern, the second insulation film pattern having an area that is larger than an area of the first insulation film pattern;
   an anode electrode covering the second insulation film pattern, an edge surface of the anode electrode having a round-shaped cross section;
   one or more emission structures covering the anode electrode; and
   a cathode electrode disposed on the one or more emission units,
   wherein the one or more emission structures comprises:
   a first emission structure surrounding a side surface and an upper surface of the anode electrode;
   a charge generation layer surrounding a side surface and an upper surface of the first emission structure; and
   a second emission structure surrounding a side surface and an upper surface of the charge generation layer,
   wherein the charge generation layer is discontinued at a boundary region between neighboring pixels.

2. The organic light emitting display panel of claim 1, wherein:
   the first emission structure comprises a p-type semiconductor layer and a n-type semiconductor layer deposited sequentially on the anode electrode,
   the second emission structure comprises a p-type semiconductor layer and a n-type semiconductor layer deposited sequentially on the charge generation layer, and
   respective first emission structures of each of the neighboring pixels are separated by the charge generation layer.

3. The organic light emitting display panel of claim 2, wherein the p-type semiconductor layer of the second emission structure is interposed between respective charge generation layers which are opposite one another between the neighboring pixels.

4. The organic light emitting display panel of claim 1, wherein the anode electrode comprises:
   a reflective metal layer disposed on the second insulation film pattern;
   an insulation film disposed on the reflective metal layer; and
   a transparent electrode disposed on the insulation film, wherein a first portion of the insulation film located at a region corresponding to a first pixel that displays a first color has a first thickness, and a second portion of the insulation film located at a region corresponding to a second pixel that displays a second color has a second thickness that is different from the first thickness.

5. A manufacturing method of an organic light emitting display panel, comprising:
   forming a transistor layer on a substrate;
   forming an insulation film on the transistor layer;
   sequentially forming a first insulation film pattern and a second insulation film pattern on the insulation film at regions corresponding to each of a plurality of pixels, the second insulation film pattern extending outwardly beyond edge surfaces of the first insulation film pattern at boundary regions between neighboring ones of the pixels;
   forming an anode electrode covering the second insulation film pattern; and
   forming one or more emission structures covering the anode electrode,
   wherein the forming of the anode electrode includes depositing a metal material.

6. The manufacturing method of claim 5, wherein the forming of the one or more emission structures comprises:
   forming a first emission structure to surround a side surface and an upper surface of the anode electrode;
   forming a charge generation layer surrounding a side surface and an upper surface of the first emission structure; and
   forming a second emission structure to surrounding a side surface and an upper surface of the charge generation layer,
   wherein the charge generation layer is discontinued on a boundary between neighboring pixels.

7. The manufacturing method of claim 6,
   wherein, in the forming of the anode electrode, a gap between neighboring anode electrodes having a width equal to twice a vertical width of the first emission structure and less than a sum of twice the vertical width of the first emission structure and twice a vertical width of the second emission structure, and
   wherein, in the forming of the second emission structure, a partial region of the second emission structure is interposed between neighboring anode electrodes.

* * * * *